US010622843B2

(12) United States Patent
Bit-Babik et al.

(10) Patent No.: US 10,622,843 B2
(45) Date of Patent: Apr. 14, 2020

(54) SYSTEM AND METHOD FOR DETERMINING A MICROWAVE BEAM AND A POWER SETTING FOR WIRELESS POWER TRANSFER WITHIN A VOLUME

(71) Applicant: MOTOROLA SOLUTIONS, INC., Schaumburg, IL (US)

(72) Inventors: Giorgi G. Bit-Babik, Plantation, FL (US); Antonio Faraone, Fort Lauderdale, FL (US)

(73) Assignee: MOTOROLA SOLUTIONS, INC., Chicago, IL (US)

(*) Notice: Subject to any disclaimer, the term of this patent is extended or adjusted under 35 U.S.C. 154(b) by 229 days.

(21) Appl. No.: 15/255,746

(22) Filed: Sep. 2, 2016

(65) Prior Publication Data

US 2018/0069438 A1    Mar. 8, 2018

(51) Int. Cl.

| G06F 3/0488 | (2013.01) |
|---|---|
| H02J 50/20 | (2016.01) |
| H04W 4/029 | (2018.01) |
| H02J 50/60 | (2016.01) |
| G01R 27/26 | (2006.01) |
| H02J 7/02 | (2016.01) |
| H04B 5/00 | (2006.01) |
| H04W 4/02 | (2018.01) |

(52) U.S. Cl.
CPC .......... *H02J 50/20* (2016.02); *G01R 27/2688* (2013.01); *H02J 7/025* (2013.01); *H02J 50/60* (2016.02); *H04B 5/0037* (2013.01); *H04W 4/02* (2013.01); *H04W 4/029* (2018.02)

(58) Field of Classification Search
CPC .................................................... G06F 3/0488
See application file for complete search history.

(56) References Cited

U.S. PATENT DOCUMENTS 9,030,161 B2 * 5/2015 Lu ........................ H02J 17/00
                                                          320/108
9,142,973 B2    9/2015 Zeine
(Continued)

OTHER PUBLICATIONS

PCT/US2017/045732 International Search Report and Written Opinion of the International Searching Authority dated Nov. 16, 2017 (13 pages).

*Primary Examiner* — Daniel Kessie
(74) *Attorney, Agent, or Firm* — Michael Best & Friedrich LLP (57) ABSTRACT

A system and method for determining a microwave beam and a power setting for wireless power transfer within a volume with a beamforming antenna. The method includes determining a perimeter for the volume, and determining a transmit power threshold based on the perimeter. The method includes establishing a communication link with a mobile electronic device within the volume, and determining a position of the mobile electronic device. The method includes sensing whether a person is located within the volume, and, when a person is located within the volume, sensing a position of the person, determining a microwave beam based on the position of the mobile electronic device and the position of the person, and determining a power setting for the microwave beam based on the position of the mobile electronic device, the position of the person, the transmit power threshold, and a power density distribution for the microwave beam.

20 Claims, 3 Drawing Sheets

(56) References Cited

U.S. PATENT DOCUMENTS

| | | |
|---|---|---|
| 9,871,387 B1 * | 1/2018 | Bell ..................... H02J 5/005 |
| 2002/0081978 A1 | 6/2002 | Hou et al. |
| 2011/0057606 A1 | 3/2011 | Saunamaki |
| 2015/0008993 A1 | 1/2015 | Chu et al. |
| 2015/0326025 A1 | 11/2015 | Bell et al. |
| 2016/0099613 A1 | 4/2016 | Bell et al. |
| 2016/0191121 A1 * | 6/2016 | Bell ................... H04B 5/0037 307/104 |
| 2016/0204622 A1 * | 7/2016 | Leabman ............... H02J 50/80 307/104 |

* cited by examiner

SYSTEM AND METHOD FOR DETERMINING A MICROWAVE BEAM AND A POWER SETTING FOR WIRELESS POWER TRANSFER WITHIN A VOLUME

BACKGROUND OF THE INVENTION

Battery-powered, mobile electronic devices are used for a variety of purposes. Public safety personnel (for example, police officers or other first responders) may use such devices during the performance of their duties. In another example, people engaging in hiking, mountain or rock climbing, hunting, or similar outdoor recreational activities may use a mobile electronic device (for example, a navigation device) to enhance their recreational experiences.

Wireless power transfer (WPT) systems may be used to recharge the batteries of mobile electronic devices. Wireless power transfer systems transfer electrical power, without wired connections, using, for example, microwave transmissions directed by a beamforming antenna onto a mobile electronic device. The mobile electronic device captures the microwave energy, and rectifies it into electrical energy to, for example, charge a battery of the device.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

One exemplary embodiment provides a method for determining a microwave beam and a power setting for wireless power transfer within a volume with a beamforming antenna controlled by an electronic processor. The method includes determining, with the electronic processor, a perimeter for the volume. The method includes determining a transmit power threshold based on the perimeter. The method includes establishing, via a transceiver, a communication link with a mobile electronic device within the volume. The method includes determining a position of the mobile electronic device. The method includes sensing, via a sensor, whether at least one person is located within the volume. The method includes, when at least one person is located within the volume, sensing, via the sensor, a position of the at least one person, determining a microwave beam based on the position of the mobile electronic device and the position of the at least one person, and determining a power setting for the microwave beam based on the position of the mobile electronic device, the position of the at least one person, the transmit power threshold, and a power density distribution for the microwave beam.

Another exemplary embodiment provides a system for determining a microwave beam and a power setting for wireless power transfer within a volume. The system includes an antenna controllable to transmit microwave beams within the volume, a transceiver, a sensor, and an electronic processor coupled to the infrared camera and the microwave transceiver. The electronic processor is configured to determine a perimeter for the volume. The electronic processor is configured to determine a transmit power threshold based on the perimeter. The electronic processor is configured to establish, via the transceiver, a communication link with a mobile electronic device within the volume. The electronic processor is configured to determine a position of the mobile electronic device. The electronic processor is configured to sense, via the sensor, whether at least one person is located within the volume. The electronic processor is configured to, when at least one person is located within the volume, sense, via the sensor, a position of the at least one person, determine a microwave beam based on the position of the mobile electronic device and the position of the at least one person, and determine a power setting for the microwave beam based on the position of the mobile electronic device, the position of the at least one person, the transmit power threshold, and a power density distribution for the microwave beam.

For ease of description, some or all of the exemplary systems presented herein are illustrated with a single exemplar of each of its component parts. Some examples may not describe or illustrate all components of the systems. Other exemplary embodiments may include more or fewer of each of the illustrated components, may combine some components, or may include additional or alternative components.

It should be noted that, in the following specification, the terms "wireless power transfer" or "wireless power transmission" refer to the wireless transfer of electrical power through radiated microwaves (that is, microwave energy emitted into the environment in the form of radiated waves, and subsequently propagating through it according to the laws of electromagnetics) using a beamforming antenna or antenna array. It should also be noted that, the terms "beamforming" and "adaptive beamforming," as used herein, refer to microwave beamforming using an antenna or antenna array, and one or more known or future-developed beamforming algorithms, or combinations thereof.

Microwave wireless power transfer systems may be used to recharge the batteries of mobile electronic devices. In some applications, microwave wireless power transfer is preferred to other forms of wireless power transfer (for example, magnetic resonant power transfer or magnetic induction transfer), because it is a longer-range technology. However, microwave power transfer may be governed by certain laws and regulations. For example, in the United States, the Federal Communications Commission enforces regulations, featuring Maximum Permissible Exposure (MPE) limits for electromagnetic field strength and power density, as well as Specific Absorption Rate (SAR) limits, concerning human exposure to radiofrequency electromagnetic fields. Accordingly, the systems and methods are provided herein for microwave wireless power transfer, which provide adequate power delivery while limiting Maximum Permissible Exposure, Specific Absorption Rate, or both. This facilitates complying with applicable regulations.

Figure 1:
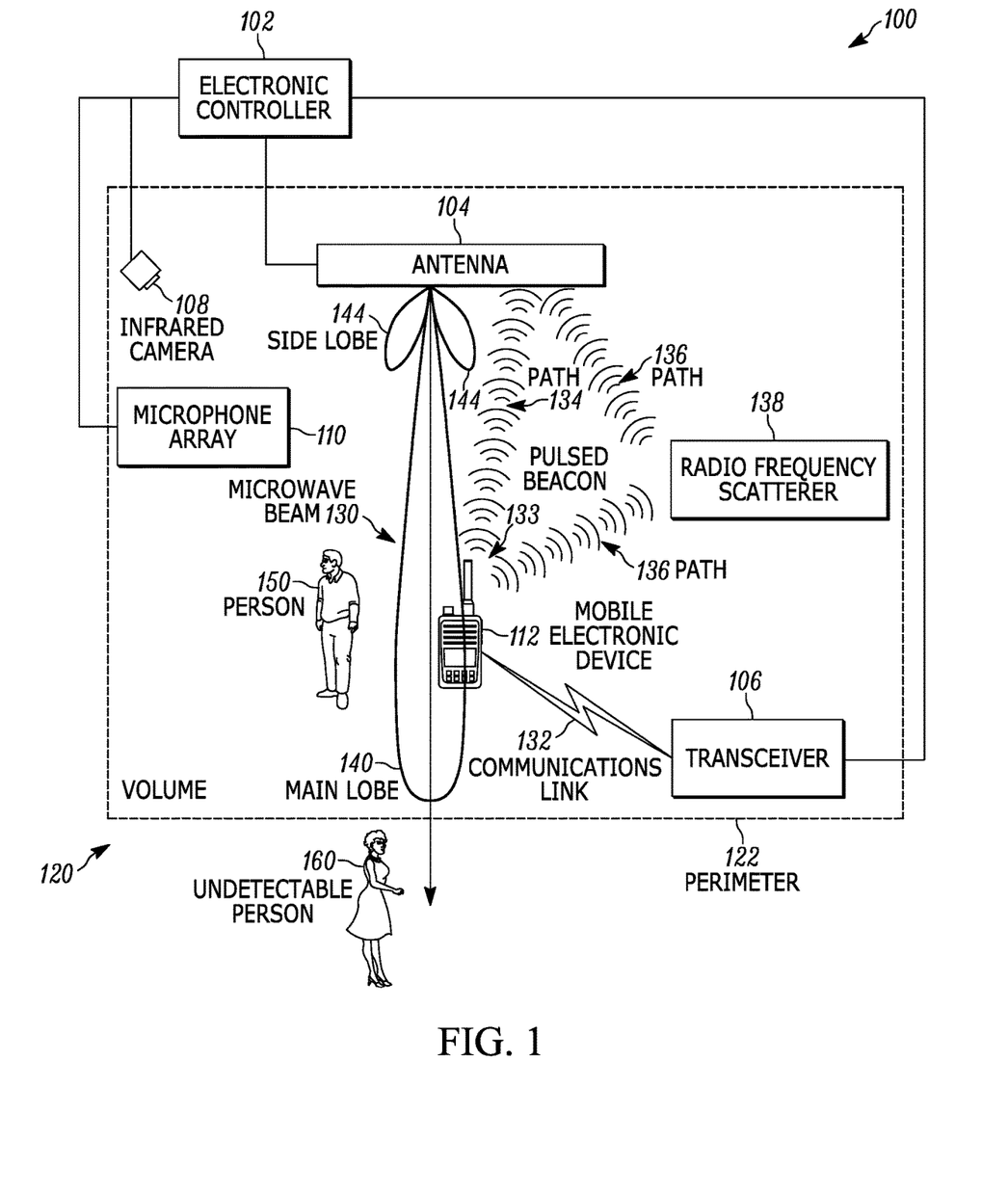
FIG. 1 is a block diagram of a system for wireless power transfer within a volume in accordance with some embodiments.

FIG. 1 is a block diagram of one exemplary embodiment of a system 100 for wireless power transfer within a volume. The system 100 includes an electronic controller 102, an antenna 104, a transceiver 106, an infrared camera 108, a microphone array 110, and a mobile electronic device 112. The electronic controller 102, the antenna 104, the transceiver 106, the infrared camera 108, the microphone array 110, as well as the other various modules are coupled directly, by one or more control or data buses or wireless communications links, or a combination thereof.

As described in greater detail below, the system 100 is positioned and configured to transmit microwave energy, (for example, to wirelessly transfer power to the mobile electronic device 112), within a volume 120. The volume 120 has a perimeter 122. In some embodiments, the volume 120 is an open area, and the perimeter 122 represents an area dividing surface, beyond which the system 100 will not be able to deliver power density levels wirelessly that may cause exceedance of the Maximum Permissible Exposure or Specific Absorption Rate limits. In other embodiments, the volume 120 is a partially or fully enclosed space (for example, a building, a room within in a building, a portion of a room, or an area that spans interior and exterior spaces). Accordingly, the perimeter 122 may include a floor, a ceiling, and one or more walls (not shown). For ease of description, the volume 120 is illustrated as a rectangular shape. This should not be considered limiting. The systems and methods described herein apply to volumes of various shapes and sizes.

The electronic controller 102, described more particularly below (with respect to FIG. 2), controls the antenna 104 to transmit a microwave beam 130 to wirelessly transfer electrical power to the mobile electronic device 112. The antenna 104 is a beamforming antenna, which includes one or more antennas and ancillary hardware (for example, a transceiver, amplifier, and the like) and software (for example, firmware to set the components of antenna 104 to form a certain microwave beam) capable of forming and transmitting microwave beams. As illustrated in FIG. 1, the microwave beam 130 includes a main lobe 140 and two side lobes 144. In general, due to the limited physical dimensions of the antenna 104, any microwave beam it forms features one or more main lobes and one or more side lobes, where the side lobes 144 may be defined, for instance, as having a peak magnitude not exceeding a predefined fraction (for example, one-tenth) of any of the main lobe 140. The side lobes 144 are an unavoidable and frequently undesirable byproduct of the limited size of an antenna. In some embodiments, the antenna 104 is an antenna array including two or more microwave antennas (also called antenna array elements). Beam-forming is frequently effected by configuring the components of antenna 104 in order to realize a desired incident-wave signal at the feed-point of each array antenna element, so that the space-time combination of the corresponding electromagnetic field vectors is constructive in certain directions (corresponding to the microwave beam lobes) and destructive in others (that is, between the lobes). Each signal incident-wave configuration corresponds bi-univocally to a microwave beam. The system 100 may be pre-configured to generate a number of pre-defined microwave beams featuring desirable characteristics, for instance low side-lobe levels (SLLs), and may also or alternatively include processing means to define microwave beams based on at least the knowledge of select electromagnetic characteristics, for instance the microwave beam, of each antenna array element. In some embodiments, the antenna 104 is also capable of receiving microwave and radiofrequency signals, converting the signals into electrical signals, and transmitting the electrical signals to the electronic controller 102 for processing.

The transceiver 106 includes hardware and software components for providing wireless communications between the electronic controller 102 and the mobile electronic device 112 via a communications link 132 using suitable network modalities (for example, Bluetooth™, near field communication (NFC), Wi-Fi™, and the like).

The infrared camera 108 includes one or more cameras, collocated or non-collocated with each other, positioned to electronically capture still images or sequences of images (that is, video) of substantially all of the volume 120, by sensing light in at least the infrared spectrum. In some embodiments, the infrared camera 108 is an infrared camera array positioned throughout the volume 120 (for example, along the perimeter 122). In some embodiments, the infrared camera 108 may be collocated or integrated with the antenna 104. The infrared camera 108 communicates the captured images to the electronic controller 102 for processing.

The microphone array 110 includes two or more microphones, collocated or non-collocated with each other, capable of sensing acoustic signals (for example, generated by the mobile electronic device 112). In some embodiments, the microphones of the microphone array 110 are positioned throughout the volume 120 (for example, along the perimeter 122). In some embodiments, the microphone array 110 may be collocated or integrated with the antenna 104. The microphone array 110 converts the sensed acoustic signals into electrical signals, and transmits the electrical signals to the electronic processor 205 via the input/output interface 215. The electronic processor 205 processes the electrical signals received from the microphone array 110 according to the methods described herein.

In some embodiments, the mobile electronic device 112, described more particularly below (with respect to FIG. 3), transmits at least one pulsed radiofrequency beacon 133, which is received by the antenna 104. The pulsed radiofrequency beacon 133 may be received by the antenna 104 directly (for example, through direct path 134), or indirectly (for example, through scattered path 136). As illustrated in FIG. 1, the scattered path 136 is the result of the reflection, refraction, diffraction (or a combination of the foregoing) of the pulsed radiofrequency beacon 133 caused by the radiofrequency scatterer 138. The radiofrequency scatterer 138 may be any object (for example, a piece of furniture, a computer, and the like) which affects electromagnetic field propagation, and the associated power density spatial distribution.

A person 150 may be present in the volume 120 while the system 100 is wirelessly transmitting electrical power to charge the mobile electronic device 112. In some instances, the person 150 is wearing or holding the mobile electronic device 112. As described more particularly below (with respect to FIG. 4) the presence and location of the person 150 is detectable by the system 100 (for example, using the infrared camera 108, the microphone array 110, or both). Persons outside the perimeter 122 may not be detectable by the system 100 (for example, the undetectable person 160).

Figure 2:
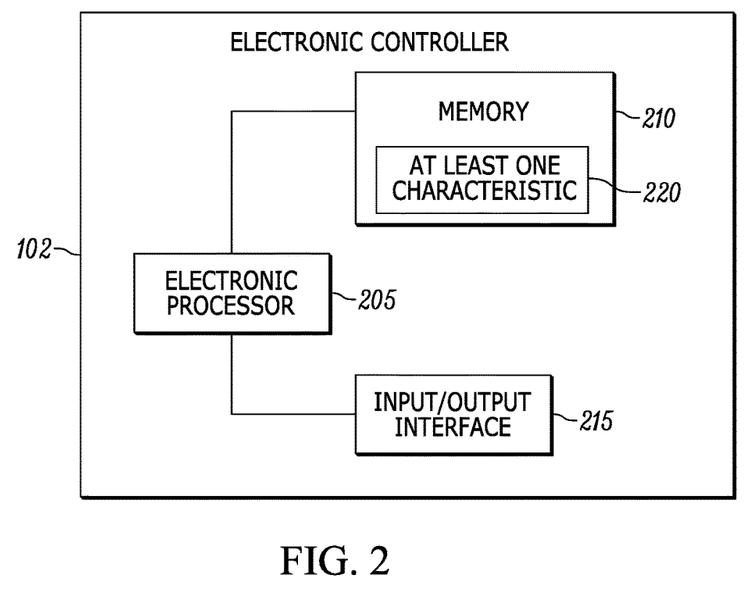
FIG. 2 is a block diagram of an electronic controller of the system of FIG. 1 in accordance with some embodiments.

FIG. 2 is a block diagram of one exemplary embodiment of the electronic controller 102. The electronic controller 102 includes an electronic processor 205, a memory 210, and an input/output interface 215. The electronic processor 205, the memory 210, and the input/output interface 215, along with other various modules and components, are coupled to each other by or through one or more control or data buses that enable communication therebetween. The memory 210 may include read-only memory (ROM), random access memory (RAM), other non-transitory computer-readable media, or a combination thereof. The memory 210 may store data, for example, at least one characteristic 220 of the volume 120, the perimeter 122, or both, as set forth in detail below. The electronic processor 205 is configured to retrieve instructions and data from the memory 210 and execute, among other things, instructions to perform the methods described herein.

The input/output interface 215 is configured to receive input and to provide output. The input/output interface 215 obtains information and signals from, and provides information and signals to (for example, over one or more wired and/or wireless connections), devices both internal and external to the electronic controller 102 (for example, the antenna 104, the transceiver 106, the infrared camera 108, and the microphone array 110).

Figure 3:
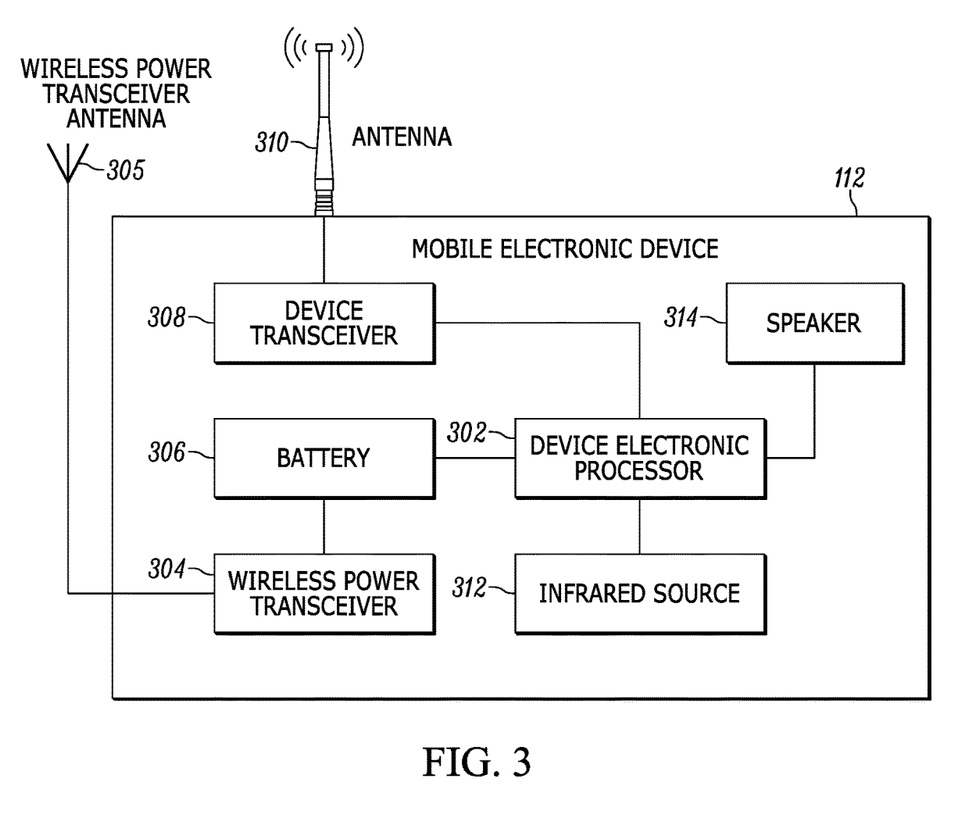
FIG. 3 is a block diagram of a mobile electronic device of the system of FIG. 1 in accordance with some embodiments.

FIG. 3 is a block diagram of one embodiment of the mobile electronic device 112. The mobile electronic device 112 includes a device electronic processor 302, a wireless power transceiver 304, a wireless power transceiver antenna 305, a battery 306, a device transceiver 308, an antenna 310, an infrared source 312, and a speaker 314. The device electronic processor 302, the wireless power transceiver 304, the battery 306, the device transceiver 308, the antenna 310, the infrared source 312, and the speaker 314, along with other various modules and components, are coupled to each other by or through one or more control or data buses, radiofrequency circuitry, or a combination of the foregoing, that enable communication therebetween.

The device electronic processor 302 is configured to retrieve instructions and data from a memory (not shown) and execute, among other things, instructions to perform the methods described herein. The wireless power transceiver 304 includes components to receive and capture microwave energy via the wireless power transceiver antenna 305 and convert it into electrical energy (for example, a rectifier). The wireless power transceiver 304 uses the electrical energy to, for example, charge the battery 306.

The device electronic processor 302 controls the wireless power transceiver 304 to transmit at least one pulsed radiofrequency beacon 133 via the wireless power transceiver antenna 305. In a preferred embodiment, the pulsed radiofrequency beacon 133 is in the same band as the microwave energy received from the antenna 104. In some embodiments, the wireless power transceiver antenna 305 is not present and the antenna 310 is shared by the wireless power transceiver 304 and the device transceiver 308.

The battery 306 is a rechargeable battery, or another suitable electrical energy accumulator (for example, a supercapacitor battery).

The device transceiver 308 includes components for establishing the wireless communications link 132 and communicating with the electronic controller 102, for example, via the antenna 310.

The infrared source 312 (for example, a light-emitting diode) is controllable by the device electronic processor 302 to emit infrared light. In some embodiments, the device electronic processor 302 modulates emission of infrared light (for example, activating and deactivating the infrared source 312 in a predetermined sequence) to convey data using a suitable protocol (for example, Infrared Data Association (IrDA) specifications). Jointly or alternatively, a visible light diode may perform an analogous function.

The speaker 314 is a transducer for reproducing sound from electrical signals received from the device electronic processor 302. The device electronic processor 302 controls (for example, using modulation) the speaker 314 to generate acoustic signals. In some embodiments, the speaker 314 may be an ultrasonic transmitter, which is capable of producing sounds in the ultrasonic frequency band. Some embodiments include both a conventional speaker and an ultrasonic transmitter.

As illustrated, the mobile electronic device 112 is a portable two-way radio (for example, a Motorola Solutions® professional radio). In alternative embodiments, the mobile electronic device 112 may be another type of electronic device equipped and configured similarly to the mobile electronic device 112 and capable of receiving wirelessly-transmitted power (for example, a smartphone).

The electronic controller 102 and the mobile electronic device 112 may include various digital and analog components, which for brevity are not described herein and which may be implemented in hardware, software, or a combination of both. Some embodiments include separate transmitting and receiving components, (for example, a transmitter and a receiver), instead of combined transceivers.

Returning to FIG. 1, it is possible that the person 150 may be present in the volume 120, that the undetectable person 160 may be present near the perimeter 122, or both, while the system 100 is wirelessly transmitting power to the mobile electronic device 112. The radiofrequency power density for a given location within or near the volume 120 varies with the shape and power setting of the microwave beam 130; the position of the person 150, and to a lesser extent the position of the undetectable person 160, relative to the microwave beam 130; and the position of the mobile electronic device 112. Accordingly, the methods are provided herein to generate the microwave beam 130 to provide adequate electrical power to charge the mobile electronic device 112, while ensuring compliance with applicable regulatory limits such as Specific Absorption Rate, Maximum Permissible Exposure Level, and the like.

Figure 4:
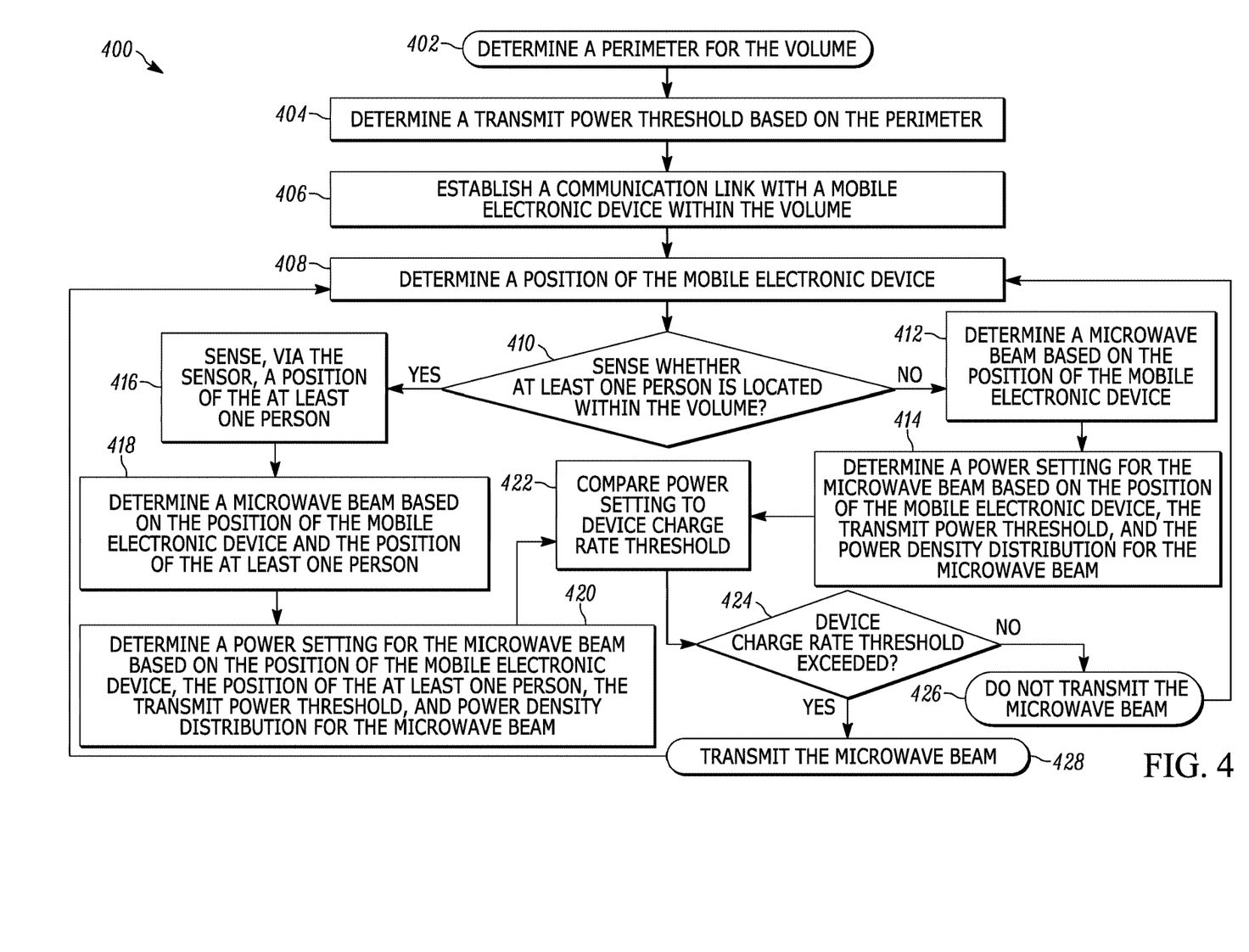
FIG. 4 is a flowchart of a method for wireless power transfer within a volume with a beamforming antenna controlled by an electronic processor in accordance with some embodiments.

FIG. 4 is a flowchart of an exemplary method 400 for wireless power transfer within a volume with a beamforming antenna. As an example, the method 400 is described in terms of a single microwave beam 130 for charging a single mobile electronic device 112, with a single person 150 (possibly) present in the volume 120. This should not be considered limiting. Embodiments of the method 400 may be used to generate multiple microwave beams to charge multiple mobile electronic devices in the presence of multiple persons, within applicable regulatory limits.

At block 402, the electronic processor 205 determines a perimeter 122 for the volume 120. In some embodiments, the electronic processor 205 retrieves the perimeter 122 from the memory 210. In other embodiments, the electronic processor determines the perimeter 122 automatically using sensors (for example, the infrared camera 108, or user input information, or visible camera, ranging device etc.). The perimeter 122 defines the volume 120, and defines an area, outside the volume 120, where the system 100 will not wirelessly transmit power in excess of regulatory allowable levels.

At block 404, the electronic processor 205 determines a transmit power threshold based on the perimeter 122. The transmit power threshold is transmit power level, for example, an effective isotropically radiated power (for example, defined as a function of angle towards all directions departing the antenna 104 and crossing the perimeter 122), which reduces the possibility that a microwave beam transmitted by the antenna 104 will generate a radiofrequency power density that exceeds applicable regulatory limits outside of the perimeter 122. In some embodiments, the electronic processor 205 determines the transmit power threshold by determining a radiofrequency power density for the microwave beam based on the at least one characteristic 220 (see FIG. 2) of the volume 120 and the perimeter 122. The at least one characteristic 220 of the volume may include that the enclosed volume 120 may not be completely enclosed. For example, there may be doors, windows, and other openings in the perimeter 122 of the volume 120, which openings affect radiofrequency propagation. Another characteristic may be the material composition of any floor, ceiling, or walls, which may also affect radiofrequency propagation. In some embodiments, the at least one characteristic 220 of the volume 120 and the perimeter 122 is stored in the memory 210 and retrieved by the electronic processor 205. In other embodiments, the at least one characteristic 220 of the volume 120 and the perimeter 122 may be provided to or retrieved by the electronic controller 102 from an outside source via the input/output interface 215.

At block 406, the electronic processor 205 establishes a communication link 132 with the mobile electronic device 112 using suitable network modalities (for example, Bluetooth™, near field communication (NFC), Wi-Fi™, and the like). At block 408, the electronic processor 205 determines a position of the mobile electronic device. In one embodiment, the electronic processor 205 sends a request, via the communications link 132, for the mobile electronic device 112 to activate the infrared source 312 to transmit predefined infrared signals. The infrared signals are received by the infrared camera 108, and used to triangulate the location of the mobile electronic device 112. In another embodiment, the electronic processor 205 sends a request, via the communications link 132, for the mobile electronic device 112 to activate the speaker 314 to transmit acoustic or ultrasonic signals, which are received by the microphone array 110, and used to triangulate the location of the mobile electronic device 112.

At block 410, the electronic processor 205, via a sensor, senses whether at least one person (for example, the person 150) is located within the volume 120. In some embodiments, the sensor is the infrared camera 108, and sensing whether a person is located within the volume includes receiving an infrared image of the volume from an infrared camera.

When a person is not sensed within the volume 120, the electronic processor 205 determines, at block 412 a microwave beam (for example, the microwave beam 130) based on the position of the mobile electronic device 112. In some embodiments, the microwave beam may be selected from a quantity of pre-determined beams, which are capable of being formed by the antenna 104. In some embodiments, the microwave beam selection is determined by transmitting a series of low-power test beams, and selecting the beam with the highest received signal by the mobile electronic device 112, as communicated from the mobile electronic device 112 via the communications link 132. In another embodiment, the microwave beam is determined by analyzing a radiofrequency beacon signal transmitted from the mobile electronic device 112 and received by the antenna 104, using known sounding techniques.

At block 414, the electronic processor 205 determines a power setting (for example the maximum power level to maximize the charge rate of the mobile electronic device 112) for the desired microwave beam based at least on the position of the mobile electronic device 112, the transmit power threshold, and a power density distribution for the microwave beam. In this case, when a person is not detected within the volume 120, the transmit power threshold is set such that the radiofrequency power density outside the volume 120 does not exceed applicable regulatory limits, and the beam has been already selected, the power density distribution may not influence the determination of the power setting, except indirectly since it impacts the charge-rate of the mobile electronic device 112.

At block 416, when the person 150 is sensed within the volume 120, the electronic processor 205 senses, via a sensor, a position of the person 150. In one embodiment, sensing the position of the person 150 includes determining the position of the person based on an infrared image received from the infrared camera 108.

At block 418, the electronic processor 205 determines a microwave beam based on at least the position of the mobile electronic device 112 and the position of the person 150. For example, as illustrated in FIG. 1, the microwave beam 130 has a line of sight to the mobile electronic device 112, and avoids placing the person 150 directly in its path.

At block 420, the electronic processor 205 determines a power setting for the microwave beam based on the position of the mobile electronic device, the position of the at least one person, the transmit power threshold, and a power density distribution for the microwave beam. The power setting is a transmit power level, for example, an effective isotropically radiated power, which reduces the possibility that the microwave beam 130, when transmitted by the antenna 104, will generate a predicted radiofrequency power density at the location of the person 150 that exceeds applicable regulatory limits in terms of Maximum Permissible Exposure, Specific Absorption Rate, or both. The predicted radiofrequency power density is based on the relative radiofrequency power density at the location and a potential transmit power level.

To address the possibility that uncertainty (for example, in the electromagnetic propagation characteristics of the environment of the volume) may produce actual radiofrequency power density levels in excess of applicable regulatory levels, some embodiments base the power setting on a power setting buffer. The power setting buffer is a reduction factor, for example 20%, which reduces the power setting to produce a predicted radiofrequency power density at some level below the applicable regulatory limit. In one example, the regulatory limit may be 10 W/m$^2$ and desirable reduction factor may be 20% below the regulatory limit. In such case, applying the power setting buffer yields a predicted radiofrequency power density 8 W/m$^2$.

Antennas are characterized assuming the antenna operating in free space. Although an empty space approximates free space, antennas do not always operate in empty spaces. Objects, for example, the radiofrequency scatterer 138, may be present in the volume 120. The more objects present in a space, the higher the chance that constructive interference of scattered radio signals may cause the actual radiofrequency power density in a location to be higher than the predicted radiofrequency power density. Accordingly, in some embodiments, the electronic processor 205 determines the power setting buffer at least in part by determining a radiofrequency power density based on the significance and distance (from the mobile electronic device 112) of a radiofrequency scatterer, or more than one radiofrequency scatterer. The antenna 104 receives a plurality of pulsed beacon responses (typically a direct path response and multiple scattered path responses that arrive with a time delay corresponding to the respective propagation path length), which are transmitted from the mobile electronic device 112. By analyzing the pulsed beacon delayed responses, the electronic processor 205 determines at least one significance value and at least one distance value, corresponding to at least one radiofrequency scatterer. Using the significance value and the distance value, the electronic processor 205 determines a power setting buffer that results in a radiofrequency power density, at the position of the mobile electronic device 112, suitable to perform device charging at required charge rate levels while maintaining compliance with applicable regulatory limits concerning radiofrequency exposure. Using known sounding techniques, it is possible to employ waveforms other than pulsed radiofrequency beacon waveforms to perform the distance and significance assessment. For instance, introducing coded bit sequences in the beaconing waveform allows estimating the mentioned parameters using a classic RAKE receiver. Indeed, to characterize the scattering environment properly, the beaconing signal should be generated in the same frequency band as the charging signal emitted by the antenna, in order to exploit the presumed reciprocity of the propagation channel.

The distance and significance parameter information is used to determine the magnitude of the power setting buffer. For example, when the pulsed radiofrequency beacon replicas due to multiple radiofrequency scatterers (such as, for example, the radiofrequency scatterer 138) arrive at the antenna array in close clusters grouped, time-wise, around the direct path beacon original, the electronic processor 205 may determine that the several scatterers are located in close proximity of the device 112. The magnitudes of the replicas relative to the original provide information about the significance of the corresponding scatterers (for example, metallic scatterers would tend to produce larger replicas than non-metallic scatterers). A large number of metallic scatterers clustered around the device 112 would indicate that significant interference occurs in the immediate surroundings of the device 112 such that power density levels may exceed the Maximum Permissible Exposure limits in the areas where field interference is constructive. In this case, increasing the buffer helps ensure compliance.

Regardless of how the power setting is determined, at block 422, the current device charge rate (determined by the power setting), communicated by the mobile electronic device 112 to processor 205 through communications link 132, is compared to a minimum acceptable device charge rate threshold to determine the minimum power setting that enables at least a trickle charge of the battery 306. At block 424, the electronic processor 205 determines whether the available power setting levels (that is, those below said transmit power threshold) allow exceeding the minimum acceptable device charge rate threshold. When the threshold cannot be exceeded, the electronic processor 205 does not transmit the microwave beam, at block 426, and continues to the method at block 408. When the device charge rate threshold can be exceeded, the electronic processor 205 transmits, via the antenna 104, the microwave beam 130. While transmitting, the electronic processor 205 repeats blocks 408 through 428 to determine a change in either the position of the mobile electronic device 112, the position of the person 150, or both. When a change is determined, the electronic processor 205 determines a microwave beam and a power setting, as described above, based on the change(s).

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for controlling a microwave beam and a power setting for wireless power transfer within a volume with a beamforming antenna controlled by an electronic processor, the method comprising:
   determining, with the electronic processor, a perimeter for the volume, the perimeter being defined by one or more surfaces;
   determining, with the electronic processor, a transmit power threshold based on the perimeter;
   establishing, via a transceiver, a communication link with a mobile electronic device within the volume;
   determining, with the electronic processor, a position of the mobile electronic device;
   sensing, via a sensor, whether at least one person is located within the volume; and
   in response to determining that at least one person is located within the volume;
      sensing, via the sensor, a position of the at least one person;
      determining, with the electronic processor, the microwave beam based on the position of the mobile electronic device and the position of the at least one person;
      determining, with the electronic processor, the power setting for the microwave beam based on the position of the mobile electronic device, the position of the at least one person, the transmit power threshold, and a radiofrequency power density distribution for the microwave beam; and
      controlling the beamforming antenna to output the microwave beam to transfer power to another device.

2. The method of claim 1, further comprising:
   when a person is not located within the volume;
      determining, with the electronic processor, a microwave beam based on the position of the mobile electronic device; and
      determining, with the electronic processor, a power setting for the microwave beam based on the position of the mobile electronic device, the transmit power threshold, and the radiofrequency power density distribution for the microwave beam.

3. The method of claim 1, wherein determining the power setting includes determining the power setting based on a power setting buffer.

4. The method of claim 3, further comprising:
   receiving, by the antenna, a plurality of pulsed beacon responses from the mobile electronic device;
   determining, with the electronic processor, at least one significance value and at least one distance value for at least one radiofrequency scatterer based on the plurality of pulsed beacon responses; and
   determining, with the electronic processor, the power setting buffer based on the at least one significance value and the at least one distance value.

5. The method of claim 1, wherein determining the position of the mobile electronic device includes determining the position of the mobile electronic device based on at least one selected from a group consisting of a pulsed radiofrequency beacon, an infrared image of the volume, an acoustic signal received from a microphone array, and an ultrasonic signal received from a microphone array.

6. The method of claim 1, wherein
   sensing whether a person is located within the volume includes receiving an infrared image of the volume from an infrared camera; and
   sensing the position of the at least one person includes determining the position of the person based on the infrared image.

7. The method of claim 1, wherein determining the transmit power threshold includes determining the transmit power threshold based on a characteristic of the volume.

8. The method of claim 1, further comprising:
   comparing, with the electronic processor, the power setting with a device charge rate threshold; and
   controlling, with the electronic processor, the beamforming antenna to transmit the microwave beam when the power setting exceeds the device charge rate threshold.

9. The method of claim 1, wherein determining the power setting based on the position of the person includes determining the power setting based on a predicted radiofrequency power density at the position of at least one the person.

10. The method of claim 1, further comprising:
    determining, with the electronic processor, a change in at least one of the position of the mobile electronic device and the position of the at least one person; and
    repeating the operations of determining the microwave beam and determining the power setting for the microwave beam based on the change.

11. A system for controlling a microwave beam and a power setting for wireless power transfer within a volume, the system comprising:
    an antenna controllable to transmit microwave beams within the volume;
    a transceiver;
    a sensor; and an electronic processor coupled to the infrared camera and the microwave transceiver, and configured to
  determine a perimeter for the volume, the perimeter being defined by one or more surfaces;
  determine a transmit power threshold based on the perimeter;
  establish, via the transceiver, a communication link with a mobile electronic device within the volume;
  determine a position of the mobile electronic device;
  sense, via the sensor, whether at least one person is located within the volume; and
  in response to determining that at least one person is located within the volume;
    sense, via the sensor, a position of the at least one person;
    determine the microwave beam based on the position of the mobile electronic device and the position of the at least one person;
    determine the power setting for the microwave beam based on the position of the mobile electronic device, the position of the at least one person, the transmit power threshold, and a radiofrequency power density distribution for the microwave beam; and
    control the beamforming antenna to output the microwave beam to transfer power to another device.

12. The system of claim 11, wherein the electronic processor is configured to, when a person is not located within the volume,
  determine a microwave beam based on the position of the mobile electronic device; and
  determine a power setting for the microwave beam based on the position of the mobile electronic device, the transmit power threshold, and the radiofrequency power density distribution for the microwave beam.

13. The system of claim 11, wherein the electronic processor is further configured to determine the power setting based on a power setting buffer.

14. The system of claim 13, wherein the electronic processor is further configured to
  receive a plurality of pulsed beacon responses from the mobile electronic device;
  determine at least one significance value and at least one distance value for at least one radiofrequency scatterer based on the plurality of pulsed beacon responses; and
  determine the power setting buffer based on the at least one significance value and the at least one distance value.

15. The system of claim 11, wherein the electronic processor is further configured to determine the position of the mobile electronic device based on at least one selected from a group consisting of a pulsed radiofrequency beacon, an infrared image of the volume, an acoustic signal received from a microphone array, and an ultrasonic signal received from a microphone array.

16. The system of claim 11, wherein the electronic processor is further configured to
  receive an infrared image of the volume from an infrared camera; and
  determine the position of the at least one person based on the infrared image.

17. The system of claim 11, wherein the electronic processor is further configured to determine the transmit power threshold based on a characteristic of the volume.

18. The system of claim 11, wherein the electronic processor is further configured to
  compare the power setting with a device charge rate threshold; and
  control the antenna to transmit the microwave beam when the power setting exceeds the device charge rate threshold.

19. The system of claim 11, wherein the electronic processor is further configured to determine the power setting based on a predicted radiofrequency power density at the position of the at least one person.

20. The system of claim 11, wherein the electronic processor is further configured to
  determine a change in at least one of the position of the mobile electronic device and the position of the at least one person; and
  repeat the operations of determining the microwave beam and determining the power setting for the microwave beam based on the change.

* * * * *